(12) United States Patent
Chen et al.

(10) Patent No.: US 10,388,692 B2
(45) Date of Patent: Aug. 20, 2019

(54) DISPLAY PANEL AND MANUFACTURING METHOD THEREOF, DISPLAY DEVICE

(71) Applicant: BOE TECHNOLOGY GROUP CO., LTD., Beijing (CN)

(72) Inventors: Xiaochuan Chen, Beijing (CN); Shengji Yang, Beijing (CN); Can Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/749,271

(22) PCT Filed: Jun. 21, 2017

(86) PCT No.: PCT/CN2017/089339
§ 371 (c)(1),
(2) Date: Jan. 31, 2018

(87) PCT Pub. No.: WO2018/086352
PCT Pub. Date: May 17, 2018

(65) Prior Publication Data
US 2019/0013350 A1 Jan. 10, 2019

(30) Foreign Application Priority Data
Nov. 11, 2016 (CN) .......................... 2016 1 0994602

(51) Int. Cl.
*H01L 27/146* (2006.01)
*H01L 27/15* (2006.01)
*H01L 27/32* (2006.01)

(52) U.S. Cl.
CPC ........ *H01L 27/156* (2013.01); *H01L 27/3206* (2013.01); *H01L 27/3234* (2013.01); *H01L 2227/32* (2013.01)

(58) Field of Classification Search
CPC .............................. G09G 3/30; H01L 27/3234
See application file for complete search history.

(56) References Cited

U.S. PATENT DOCUMENTS

2004/0263069 A1* 12/2004 Yamazaki ................ G09G 3/30
313/506
2013/0314546 A1 11/2013 De Groot

FOREIGN PATENT DOCUMENTS

CN 1577416 A 2/2005
CN 103392335 A 11/2013
(Continued)

OTHER PUBLICATIONS

International Search Report of PCT/CN2017/089339 in Chinese, dated Sep. 11, 2017 with English translation.
(Continued)

*Primary Examiner* — Thomas L Dickey
(74) *Attorney, Agent, or Firm* — Collard & Roe, P.C.

(57) ABSTRACT

A display panel and a manufacturing method thereof and a display device are provided. The display panel includes a semiconductor base substrate, a display array and a thermal imagination array. The display array is formed on the semiconductor base substrate, and includes a plurality of display pixels arranged in an array, and each of the display pixels includes at least one display sub-pixel, and each display sub-pixel includes a light-emitting component. The thermal imagination array is formed on the semiconductor base substrate and includes a plurality of thermal imagination pixels, and each of the thermal imagination pixels includes at least one thermal imagination sub-pixel, and display sub-pixels and thermal imagination sub-pixels are arranged in a blending way.

19 Claims, 3 Drawing Sheets

(56) References Cited

FOREIGN PATENT DOCUMENTS

| CN | 104795017 A | 7/2015 |
|----|-------------|--------|
| CN | 106449716 A | 2/2017 |
| CN | 106653802   | 5/2017 |

OTHER PUBLICATIONS

Notice of Transmittal of the International Search Report of PCT/CN2017/089339 in Chinese, dated Sep. 11, 2017.

Written Opinion of the International Searching Authority of PCT/CN2017/089339 in Chinese, dated Sep. 11, 2017 with English translation.

* cited by examiner

DISPLAY PANEL AND MANUFACTURING METHOD THEREOF, DISPLAY DEVICE

CROSS REFERENCE TO RELATED APPLICATIONS

This application is the National Stage of PCT/CN2017/089339 filed on Jun. 21, 2017, which claims priority under 35 U.S.C. § 119 of Chinese Application No. 201610994602.2 filed on Nov. 11, 2016, the disclosure of which is incorporated by reference.

TECHNICAL FIELD

Embodiments of the present disclosure relate to a display panel and a manufacturing method thereof and a display device.

BACKGROUND

Micro displays based on light-emitting diodes are one of the hotspots in the research field of Virtual Reality (VR) and Augmented Reality (AR). Compared with a liquid crystal display, micro displays based on light-emitting diodes possess advantages of small volume, low energy consumption, low production cost, self-luminescence, wide angle of view and fast response speed, and then gradually replace the traditional liquid crystal displays in the field of smart glasses, head mounted displays, night vision devices and so on.

SUMMARY

An embodiment of the present disclosure provides a display panel, and the display panel comprises a semiconductor base substrate, a display array and a thermal imagination array. The display array is provided on the semiconductor base substrate and comprises a plurality of display pixels arranged in an array, and each of the display pixels comprises at least one display sub-pixel, and each display sub-pixel comprises a light-emitting component. The thermal imagination array is provided on the semiconductor base substrate and comprises a plurality of thermal imagination pixels, and each of the thermal imagination pixels comprises at least one thermal imagination sub-pixel, and display sub-pixels and thermal imagination sub-pixels are arranged in a blending way.

Another embodiment of the present disclosure provides a display device, and the display device comprises the display panel mentioned above.

Another embodiment of the present disclosure provides a manufacturing method of the display panel, and the manufacturing method comprises providing a semiconductor base substrate and forming a display array and a thermal imagination array on the semiconductor base substrate. The display array comprises a plurality of display pixels arranged in an array, and each of the display pixels comprises at least one display sub-pixel, and each display sub-pixel comprises a light-emitting component. The thermal imagination array comprises a plurality of thermal imagination pixels, and each of the thermal imagination pixels comprises at least one thermal imagination sub-pixel, and display sub-pixels and thermal imagination sub-pixels are arranged in a blending way.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
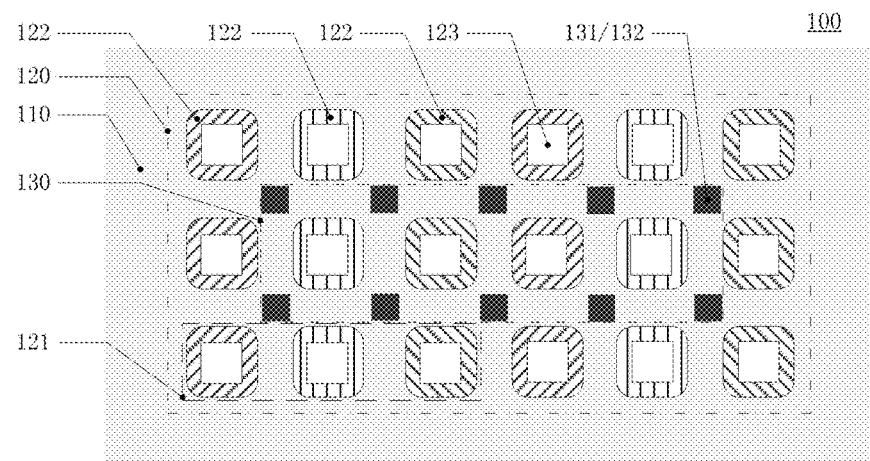
FIG. 1 is a plane schematic diagram of a display panel provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. It should be noted that features shown in the drawings are not necessarily drawn in a real scale. Descriptions about the known materials, components and process technologies are omitted so as not to render the exemplary embodiments of the present disclosure obscure. The given examples aim to help to understand the implementation of the exemplary embodiments of the present disclosure and further to enable those skilled in the art to implement the exemplary embodiments. Therefore, these examples should not be interpreted as limitative of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Besides, same or similar reference numbers indicate same or similar components in each embodiment of the present disclosure.

Thermal imaging technology has been widely used in fields of military, medicine, security monitoring etc. However, due to the large volume, weight and cost of existing thermal imaging modules, the thermal imaging technology has not been popularized in the field of civil application. The volume, weight, cost and power consumption of a display device will be increased if the existing thermal imaging modules are introduced to make the display device have a function of thermal imaging, which is contrary to the demands and expectations of current consumers for electronics, especially consumer electronics.

Embodiments of the present disclosure provide a display panel, a display device and a manufacturing method of the display panel. By integrating the thermal imaging function in the display panel, the display panel and the display device can have a function of thermal imaging, and meanwhile volume and weight of the display panel and the display device are reduced.

An embodiment of the present disclosure provides a display panel, and the display panel comprises a semiconductor base substrate, a display array and a thermal imagination array. The display array is formed on the semiconductor base substrate and comprises a plurality of display pixels arranged in an array, and each of the display pixels comprises at least one display sub-pixel, and each display sub-pixel comprises a light-emitting component; the thermal imagination array is formed on the semiconductor base substrate and comprises a plurality of thermal imagination pixels, and each of the thermal imagination pixels comprises at least one thermal imagination sub-pixel, and display sub-pixels and thermal imagination sub-pixels are arranged in a blending way. The projections of the display sub-pixels on the semiconductor base substrate are not overlapped with the projections of the thermal imagination pixels on the semiconductor base substrate.

For example, FIG. 1 is a plane schematic diagram of a display panel 100 provided by an embodiment of the present disclosure. As shown in FIG. 1, the display panel 100 comprises a semiconductor base substrate 110, a display array 120 and a thermal imagination array 130. The display array 120 is formed on the semiconductor base substrate 110 and comprises a plurality of display pixels 121 arranged in an array, and each of the display pixels 121 comprises three display sub-pixels 122, and each display sub-pixel 122 comprises a light-emitting component 123, and luminescent colors of the light-emitting components 123 of three adjacent display sub-pixels 122 in the display pixel 121 differ from each other (for example, red light, green light and blue light). The thermal imagination array 130 is formed on the semiconductor base substrate 110 and comprises a plurality of thermal imagination pixels 131, and each of the thermal imagination pixels 131 comprises a thermal imagination sub-pixel 132. The display sub-pixels 122 and the thermal imagination sub-pixels 132 are arranged in a blending way, for example, each of the thermal imagination sub-pixels 132 is arranged among four adjacent display sub-pixels 122. The blending way in which the display sub-pixels 122 and the thermal imagination sub-pixels 132 are arranged is not limited to the case shown in FIG. 1, and it can also be the cases as described below.

Figure 2:
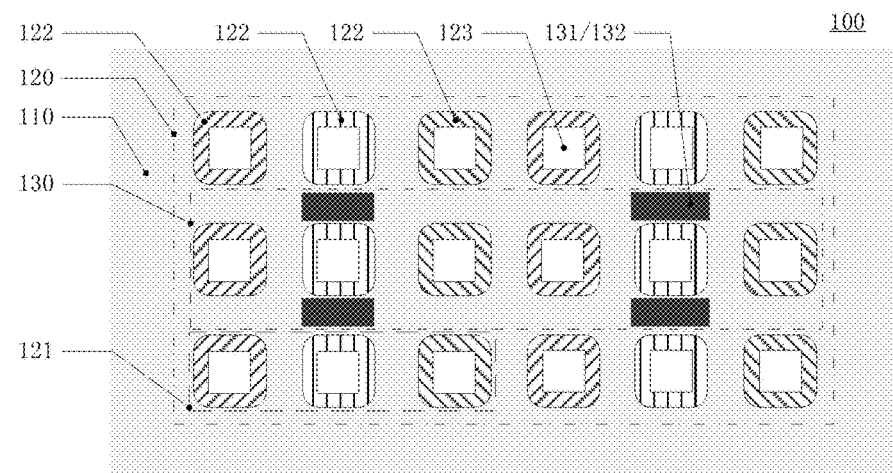
FIG. 2 is a plane schematic diagram of another structure of a display panel provided by an embodiment of the present disclosure.

For example, as shown in FIG. 2, each of the display pixels 121 comprises three display sub-pixels 122, and luminescent colors of the light-emitting components 123 of three display sub-pixels 122 in the display pixel 121 differ from each other. Each of the thermal imagination pixels 131 comprises a thermal imagination sub-pixel 132, and each of the thermal imagination pixels 131/thermal imagination sub-pixel 132 is arranged between two adjacent display pixels 121 in a column direction; it is obvious that each of the thermal imagination pixels 131/thermal imagination sub-pixel 132 can also be arranged between two adjacent display pixels 121 in a row direction or arranged among four adjacent display pixels 121 (composed of four adjacent display pixels in two adjacent rows and two adjacent columns), or arranged between two adjacent display sub-pixels 122 in the row direction or the column direction.

Figure 3:
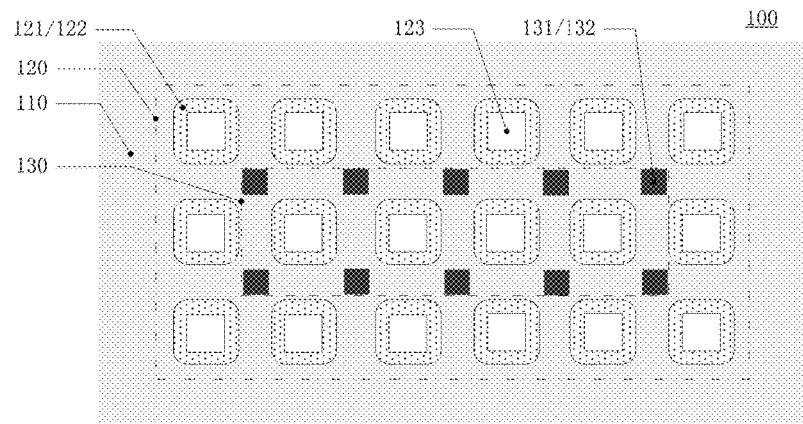
FIG. 3 is a plane schematic diagram of still another structure of a display panel provided by an embodiment of the present disclosure.

For example, as shown in FIG. 3, each of the display pixels 121 comprises a display sub-pixel 122, and each of the thermal imagination pixels 131 comprises a thermal imagination sub-pixel 132. Each of the thermal imagination pixels 131/thermal imagination sub-pixel 132 is arranged among four adjacent display sub-pixels 122 (composed of four adjacent display sub-pixels in two adjacent rows and two adjacent columns), it is obvious that each of the thermal imagination pixels 131/thermal imagination sub-pixel 132 can also be arranged between two adjacent display pixels 121 in a row direction or a column direction.

For example, when the arrangement of the pixels of the display array is a delta pixels arrangement, each of the thermal imagination pixels 131/thermal imagination sub-pixel 132 can also be arranged among three adjacent display sub-pixels 122 or three adjacent display pixels 121.

In addition, each of the thermal imagination pixels 131 can also comprise a plurality of thermal imagination sub-pixels 132 (for example, each of the thermal imagination pixels 131 comprises three thermal imagination sub-pixels 132), and the operating wavelengths of the thermal imagination sub-pixels 132 in the thermal imagination pixels 131 can be different. The thermal imagination sub-pixels 132 can be arranged between the display sub-pixels 122 in a blending way according to actual application demands, which is not limit to embodiments of the present disclosure.

For example, according to actual application demands, the thermal imagination sub-pixels 132 can be arranged between two adjacent pixels or among three or four adjacent display pixels 121 or between two adjacent sub-pixels or among three or four adjacent display sub-pixels 122 in the whole display array 120, and the thermal imagination sub-pixels 132 can be arranged between two adjacent pixels or among three or four adjacent display pixels 121 or between two adjacent sub-pixels or among three or four adjacent display sub-pixels 122 only in a certain area of the display array 120. In addition, the pitch and density of the thermal imagination sub-pixels 132 can be set correspondingly according to the display array 120 and actual application demands.

For example, according to actual application demands, a size of the thermal imagination sub-pixel 132 can be less than a size of the display sub-pixel 122. It is obvious that the size of the thermal imagination sub-pixel 132 can also be equal to or larger than the size of the display sub-pixel 122.

For example, according to actual application demands, a height of a working surface (a surface for receiving electromagnetic waves, for example, a surface for receiving infrared) of the thermal imagination sub-pixel 132 can be higher than a height of a luminescent surface of the display sub-pixel 122. It is obvious that the height of a working surface can also be equal to or lower than the height of a luminescent surface of the display sub-pixel 122.

For example, according to actual application demands, the thermal imagination sub-pixels 132 can be blended between the display sub-pixels 122 in an alternative way. For example, one of several (for example, four) adjacent display sub-pixels 122 in the row direction can be replaced by the thermal imagination sub-pixels 132. And for example, one of several (for example, four) adjacent display sub-pixels 122 in the column direction can be replaced by the thermal imagination sub-pixels 132. Cases are not limit to embodiments of the present disclosure.

In summary, for different arrangements of the pixel array and actual application demands, the blending way in which the display sub-pixels 122 and the thermal imagination sub-pixels 132 are arranged can be set according to specific cases and demands. Therefore, the blending arrangement of the display sub-pixels 122 and the thermal imagination sub-pixels 132 is not limit to embodiments of the present disclosure.

Since the display sub-pixels 122 and the thermal imagination sub-pixels 132 are arranged in a blending way, the thermal imagination array 130 does not need to take up extra space of the display panel 100 so that a size of the display panel 100 can be reduced, an integration level of a product can be improved and volume of the product can be reduced.

For example, a material for making the semiconductor base substrate 110 can be monocrystalline silicon, germanium or gallium arsenide, preferably monocrystalline silicon. For example, the thermal imagination array 130 can be formed on the semiconductor base substrate 110 by a manufacturing process of a semiconductor integrated circuit (for example, a manufacturing process of micro-electromechanical systems). For example, the light-emitting component 123 can be an organic light-emitting diode or an inorganic light-emitting diode (for example, micro LED). For example, a light-emitting component based on an organic light-emitting diode can be formed in the way described below. First, a driving array layer is prepared on the semiconductor base substrate 110 by a manufacturing process of a semiconductor integrated circuit, and the driving array layer comprises a driving circuit (for example, comprising a switch transistor, a drive transistor, a memory capacitor, etc.) configured for the light-emitting component. Then, an electrode layer is formed on the driving array layer which comprises the driving circuit, and the electrode layer, for example, is electrically connected with a source or a drain of the driving transistor, and then each organic functional layer is evaporated on the electrode layer, for example, an electron injection layer, an electron transport layer, an organic light-emitting layer, a hole transport layer, a hole injection layer and a transparent electrode. For example, a light-emitting component based on an inorganic light-emitting diode (for example, micro LED) can be formed on the semiconductor base substrate 110 by an MOCVD (metal organic compound chemical vapor deposition) process.

An existing circuit structure can be used for the thermal imagination array 130, and the thermal imagination array 130 can be obtained by a semiconductor preparation process. The process of a semiconductor integrated circuit, for example, can be carried out by referring to an existing process of a thermal imagination array (a thermal imaging device) and a display device, no repeat herein. For example, every thermal imagination sub-pixel of the thermal imagination array 130 can comprise a thermal radiation sensing unit (for example, a heat-sensing component) and a pixel circuit, for example, the pixel circuit is a CMOS pixel circuit which can comprise a switch transistor, a memory capacitor, and an amplifying circuit, etc. For example, a material used for preparing the thermal radiation sensing unit can be Vanadium Oxide ($VO_X$). For example, a vanadium oxide film can be deposited on the semiconductor base substrate and the thermal radiation sensing unit is formed by a method of sputtering or pulsed laser deposition. Because the thermal imagination array based on Vanadium Oxide does not need refrigeration during work, therefore volume, weight, and cost of the display panel and the display device that contains the display panel can be greatly reduced.

For example, the thermal radiation sensing unit (for example, a heat-sensing component) in the thermal imagination pixels 131 can work under a middle-infrared band or/and a far-infrared band. For example, operating wavelengths of the thermal imagination pixels 131 which work under the middle-infrared band can be between 3-5 microns, and operating wavelengths of the thermal imagination pixels 131 which work under the far-infrared band can be between 8-14 microns.

Because the thermal imagination array and transistors etc., for example, can be directly formed on the semiconductor base substrate by the manufacturing process of a semiconductor integrated circuit, therefore sizes of the thermal imagination array and transistors can be reduced and external connecting lines can be reduced, and thus volume and weight of the display panel and the display device can be reduced. The organic light-emitting diode can be formed on the semiconductor base substrate by an evaporation process or the inorganic light-emitting diode (for example, micro LED) can be formed on the semiconductor base substrate by a MOCVD process. Therefore, the thermal imaging function can be integrated in the display panel, thus volume and weight of the display panel and the display device can be reduced and meanwhile the display panel and the display device possess the thermal imaging function.

Figure 4:
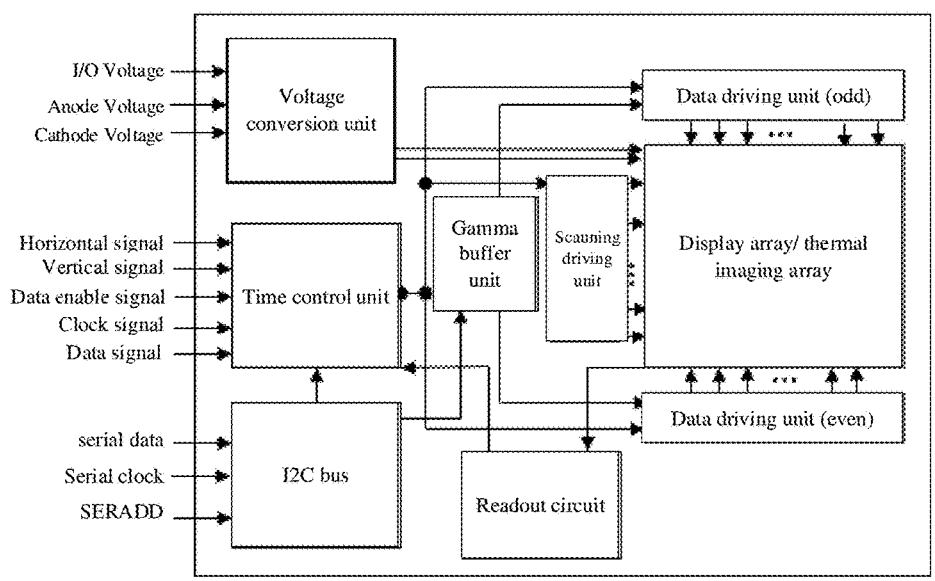
FIG. 4 is a schematic diagram of functional modules of a display panel provided by an embodiment of the present disclosure.

For example, FIG. 4 is a schematic diagram of functional modules of a display panel provided by an embodiment of the present disclosure. As shown in FIG. 4, the display panel further comprises a readout circuit. The readout circuit can be formed on the semiconductor base substrate and configured to read out image signals acquired by the thermal imagination array. For example, the readout circuit can be formed on the semiconductor base substrate by the manufacturing process of a semiconductor integrated circuit.

For example, as shown in FIG. 4, the display panel can further comprises a time control unit, a data driving unit and a scanning driving unit, etc. The time control unit is configured to control the light-emitting components in the in the display array by controlling the data driving unit and the scanning driving unit so that display function is realized. For example, the display panel can further comprise a gamma buffer unit, and the gamma buffer unit is configured to detect a dark part and a light part of an image signal and increase the ratio of them so as to improve the contrast of a display image. For example, the time control unit, the data driving unit, the scanning driving unit and the gamma buffer unit can be formed on the semiconductor base substrate by the manufacturing process of a semiconductor integrated circuit.

For example, thermal images acquired by the readout circuit can also be passed to the time control unit as an input of the display data to the time control unit, and thus the thermal images acquired by the thermal imagination array can be displayed.

For example, as shown in FIG. 4, the display panel can further comprise an I2C bus. The I2C bus (Inter-IC bus) is a two-way continuous bus of two lines which is configured to provide telecommunication lines between integrated circuits. In the display panel, the I2C bus is configured to realize telecommunication of the time control unit and the gamma buffer unit. The I2C bus, for example, can be formed on the semiconductor base substrate by the manufacturing process of a semiconductor integrated circuit. For example, as shown in FIG. 4, the display panel can further comprise a voltage conversion unit. The voltage conversion unit is configured to receive an external voltage and convert the external voltage to a proper voltage to drive the display array and the thermal imagination array. The SERADD shown in FIG. 4 is a minimum weighting bit address for a serial interface.

One or more of the readout circuit, the time control unit, the data driving unit, the scanning driving unit, the gamma buffer unit and the I2C bus can be directly formed on the semiconductor base substrate by the manufacturing process of a semiconductor integrated circuit, so the size of the panel can be reduced and the external connecting lines can be reduced so that the volume, weight, and cost of the display panel and the display device can be reduced.

Figure 5:
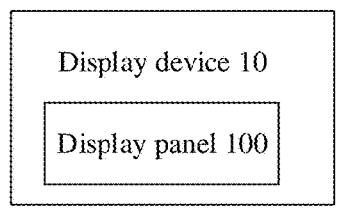
FIG. 5 is a schematic diagram of a display device provided by still another embodiment of the present disclosure.

For example, FIG. 5 is a schematic diagram of a display device 10 provided by another embodiment of the present disclosure. The display device 10 comprises the display panel 100 provided by any one of the embodiments of the present disclosure. It should be noted that all other necessary components of the display device 10 are acknowledged to be included therein by those skilled in the art, no repeat herein and they should not cause any limitations to the present disclosure. The thermal imaging function can be integrated in the display panel 100 by the display device 10 so that volume and weight of the display panel and the display device can be reduced and meanwhile the display panel and the display device possess the thermal imaging function.

For example, based on the same inventive concept, an embodiment of the present disclosure further provides a manufacturing method of a display panel. The manufacturing method of the display panel comprises: providing a semiconductor base substrate and forming a display array and a thermal imagination array on the semiconductor base substrate. The display array comprises a plurality of display pixels arranged in an array, and each of the display pixels comprises at least one display sub-pixel, and each display sub-pixel comprises a light-emitting component. The thermal imagination array comprises a plurality of thermal imagination pixels, and each of the thermal imagination pixels comprises at least one thermal imagination sub-pixel, and display sub-pixels and thermal imagination sub-pixels are arranged in a blending way.

Figure 6:
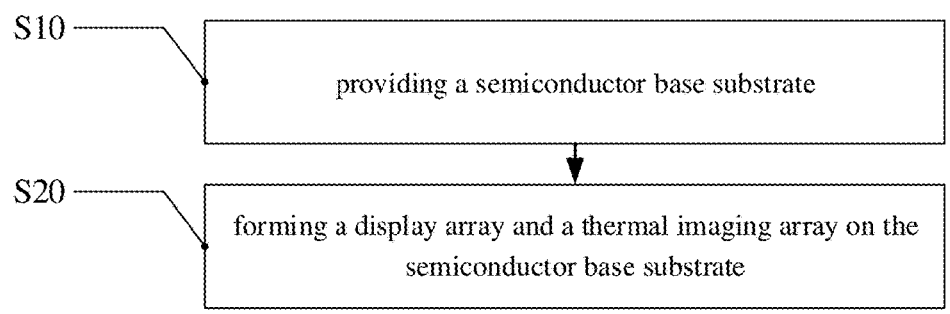
FIG. 6 is a flow diagram of a manufacturing method of a display panel provided by further still another embodiment of the present disclosure.

For example, FIG. 6 is a flow diagram of a manufacturing method of a display panel provided by another embodiment of the present disclosure. Taking the case illustrated in FIG. 1 for an example, as shown in FIG. 6, the manufacturing method of the display panel comprises the following steps:

Step 10: providing a semiconductor base substrate;

Step 20: forming a display array and a thermal imagination array on the semiconductor base substrate.

For example, as shown in FIG. 1, forming a display array and a thermal imagination array on the semiconductor base substrate comprises forming a plurality of display pixels arranged in an array on the semiconductor base substrate, and each of the display pixels comprises three display sub-pixels, and each display sub-pixel comprises a light-emitting component, and luminescent colors of light-emitting components of the three display sub-pixels in the display pixel differ from each other (for example, red, green and blue). For example, forming a display array and a thermal imagination array on the semiconductor base substrate further comprises forming a plurality of thermal imagination pixels, and each of the thermal imagination pixels comprises one thermal imagination sub-pixel. Display sub-pixels and thermal imagination sub-pixels are arranged in a blending way, for example, each of the thermal imagination sub-pixels is arranged among four adjacent display sub-pixels. The blending way in which the display sub-pixels and the thermal imagination sub-pixels are arranged is not limited to the above mentioned case, and other arrangements can be referred to the embodiments of the display panel, and are not limit to embodiments of the present disclosure. Since the display sub-pixels and the thermal imagination sub-pixels are arranged in a blending way, the thermal imagination array does not need to take up extra space of the display panel so that a size of the display panel can be reduced, an integration level of a product can be improved and volume of the product can be reduced.

For example, a material for making the semiconductor base substrate can be monocrystalline silicon, germanium or gallium arsenide, preferably monocrystalline silicon.

For example, the light-emitting component can be an organic light-emitting diode or an inorganic light-emitting diode (for example, micro LED). For example, a light-emitting component based on an organic light-emitting diode can be formed in the way described below. First, a driving array layer is prepared on the semiconductor base substrate by a manufacturing process of a semiconductor integrated circuit, and the driving array layer comprises a driving circuit (for example, comprising a switch transistor, a drive transistor, a memory capacitor, etc.) configured for the light-emitting component. Then, an electrode layer is formed on the driving array layer which comprises the driving circuit, and the electrode layer, for example, is electrically connected with a source or a drain of the driving transistor, and then each organic functional layer is evaporated on the electrode layer, for example, an electron injection layer, an electron transport layer, an organic light-emitting layer, a hole transport layer, a hole injection layer and a transparent electrode. A light-emitting component based on an inorganic light-emitting diode (for example, micro LED) can be formed on the semiconductor base substrate by a MOCVD (metal organic compound chemical vapor deposition) process.

For example, every thermal imagination sub-pixel of the thermal imagination array can comprise a thermal radiation sensing unit and a pixel circuit. For example, the pixel circuit is a CMOS pixel circuit which can comprise a switch transistor, a memory capacitor, and an amplifying circuit, etc. For example, the thermal radiation sensing unit and the pixel circuit can be formed on the semiconductor base substrate by a manufacturing process of a semiconductor integrated circuit (for example, a manufacturing process of micro-electromechanical systems). For example, a vanadium oxide film can be deposited on the semiconductor base substrate and the thermal radiation sensing unit is formed by a method of sputtering or pulsed laser deposition. Because the thermal imagination array based on Vanadium Oxide does not need refrigeration during work, therefore volume, weight, and cost of the display panel and the display device that contains the display panel can be greatly reduced.

For example, the thermal imagination pixels can work under a middle-infrared band or/and a far-infrared band. For example, operating wavelengths of the thermal imagination pixels which work under the middle-infrared band can be between 3-5 microns, and operating wavelengths of the thermal imagination pixels which work under the far-infrared band can be between 8-14 microns.

Because the thermal imagination array and transistors can be directly formed on the semiconductor base substrate by the manufacturing process of a semiconductor integrated circuit, therefore sizes of the thermal imagination array and transistors can be reduced and external connecting lines can be reduced, and thus volume and weight of the display panel and the display device can be reduced. The organic light-emitting diode can be formed on the semiconductor base substrate by an evaporation process or the inorganic light-emitting diode (for example, micro LED) can be formed on the semiconductor base substrate by a MOCVD process. Therefore, the thermal imaging function can be integrated in the display panel, thus volume and weight of the display panel and the display device can be reduced and the display panel and the display device possess the thermal imaging function meanwhile.

For example, the manufacturing method further comprises forming one or more of a read-out circuit, a time control unit, a data driving unit, a scanning driving unit, a gamma buffer unit and an I2C bus on the semiconductor base substrate by, for example, a manufacturing process of a semiconductor integrated circuit. For example, the readout circuit can be formed on the semiconductor base substrate and configured to read out image signals acquired by the thermal imagination array. For example, the time control unit is configured to control the light-emitting components in the display array by controlling the data driving unit and the scanning driving unit so that display function is realized. For example, the gamma buffer unit is configured to detect a dark part and a light part of an image signal and increase the ratio of them so as to improve the contrast of a display image. For example, thermal images acquired by the readout circuit can also be passed to the time control unit as an input of the display data to the time control unit, thus the thermal images acquired by the thermal imagination array can be displayed. For example, the I2C bus is configured to realize telecommunication of the time control unit and the gamma buffer unit.

Because one or more of the readout circuit, the time control unit, the data driving unit, the scanning driving unit, the gamma buffer unit and the I2C bus can be directly formed on the semiconductor base substrate by the manufacturing process of a semiconductor integrated circuit, therefore the size of the panel can be reduced and the external connecting lines can be reduced so that volume, weight, and cost of the display panel and the display device can be further reduced.

Embodiments of the present disclosure provide a display panel, a display device and a manufacturing method of the display panel. The display panel and the display device can have a function of thermal imaging and volume and weight of the display panel and the display device are reduced meanwhile by integrating the thermal imaging function in the display panel.

Although the present disclosure is described in detail in the above by general description and embodiments, some modifications or improvements on the basis of embodiments of the present disclosure can be made, which is obvious to those skilled in the art. Therefore, the modifications or improvements made without departing from the spirits and the scope of the present disclosure shall all fall within the protection scope of the present disclosure.

The application claims priority to the Chinese patent application No. 201610994602.2, filed on Nov. 11, 2016, the entire disclosure of which is incorporated herein by reference as part of the present application.

What is claimed is:

1. A display panel, comprising:
a semiconductor base substrate;
a display array, which is provided on the semiconductor base substrate and comprises a plurality of display pixels arranged in an array, wherein each of the display pixels comprises at least one display sub-pixel, and each display sub-pixel comprises a light-emitting component; and
a thermal imagination array, which is provided on the semiconductor base substrate and comprises a plurality of thermal imagination pixels, wherein each of the thermal imagination pixels comprises at least one thermal imagination sub-pixel, and
display sub-pixels of the plurality of display pixels and thermal imagination sub-pixels of plurality of thermal imagination pixels are arranged in a blending way;
wherein a working band of the thermal imagination pixels is a middle-infrared band or/and a far-infrared band.

2. The display panel according to claim 1, wherein each of the thermal imagination sub-pixels comprises a thermal radiation sensing unit, and the thermal radiation sensing unit is a heat-sensing component.

3. The display panel according to claim 2, wherein each of the thermal imagination pixels is arranged between two adjacent pixels or among three or four adjacent display pixels.

4. The display panel according to claim 1, wherein a material of the semiconductor base substrate comprises monocrystalline silicon, germanium or gallium arsenide.

5. The display panel according to claim 4, wherein each of the thermal imagination pixels is arranged between two adjacent pixels or among three or four adjacent display pixels.

6. The display panel according to claim 1, wherein the light-emitting component is an organic light-emitting diode or an inorganic light-emitting diode.

7. The display panel according to claim 6, wherein each of the thermal imagination pixels is arranged between two adjacent pixels or among three or four adjacent display pixels.

8. The display panel according to claim 1, further comprising a readout circuit, wherein the readout circuit is provided on the semiconductor base substrate and is configured to read out image signals acquired by the thermal imagination array.

9. The display panel according to claim 8, wherein each of the thermal imagination pixels is arranged between two adjacent pixels or among three or four adjacent display pixels.

10. The display panel according to claim 1, wherein each of the thermal imagination pixels is arranged between two adjacent pixels or among three or four adjacent display pixels.

11. The display panel according to claim 1, wherein each of the display pixels comprises at least three display sub-pixels, luminescent colors of light-emitting components of the at least three display sub-pixels in the display pixel differ from each other, and each of the thermal imagination sub-pixels is arranged between two adjacent sub-pixels or among three or four adjacent display sub-pixels.

12. A display device, comprising the display panel according to claim 1.

13. The display panel according to claim 1, wherein each of the thermal imagination pixels is arranged between two adjacent pixels or among three or four adjacent display pixels.

14. A manufacturing method of the display panel, comprising:
providing a semiconductor base substrate; and
forming a display array and a thermal imagination array on the semiconductor base substrate,
wherein the display array comprises a plurality of display pixels arranged in an array, and each of the display pixels comprises at least one display sub-pixel, and each display sub-pixel comprises a light-emitting component; the thermal imagination array comprises a plurality of thermal imagination pixels, and each of the thermal imagination pixels comprises at least one thermal imagination sub-pixel; display sub-pixels and thermal imagination sub-pixels are arranged in a blending way; and
a working band of the thermal imagination pixels is a middle-infrared band or / and a far-infrared band.

15. The manufacturing method according to claim 14, wherein the thermal imagination pixels are directly formed on the semiconductor base substrate by a manufacturing process of micro-electromechanical systems.

16. The manufacturing method according to claim 14, further comprising a readout circuit, wherein the readout circuit is formed on the semiconductor base substrate and is configured to read out image signals acquired by the thermal imagination array.

17. The manufacturing method according to claim 16, further comprising a time control unit, wherein the time control unit is formed on the semiconductor base substrate, and the time control unit is configured to receive image signals acquired by the thermal imagination array.

18. The manufacturing method according to claim 14, wherein each of the thermal imagination pixels is arranged between two adjacent pixels or among three or four adjacent display pixels.

19. The manufacturing method according to claim 14, wherein each of the display pixels comprises at least three display sub-pixels, luminescent colors of the light-emitting components of the at least three display sub-pixels in the display pixel differ from each other, and each of the thermal imagination sub-pixels is arranged between two adjacent sub-pixels or among three or four adjacent display sub-pixels.

\* \* \* \* \*